United States Patent
Prabhu et al.

(10) Patent No.: US 8,964,341 B2
(45) Date of Patent: Feb. 24, 2015

(54) GATE DIELECTRIC PROTECTION

(75) Inventors: Manjunatha Govinda Prabhu, Singapore (SG); Mahadeva Iyer Natarajan, Clifton Park, NY (US); Da-Wei Lai, Singapore (SG); Ryan Shan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 184 days.

(21) Appl. No.: 13/457,453

(22) Filed: Apr. 26, 2012

(65) Prior Publication Data
US 2013/0286516 A1    Oct. 31, 2013

(51) Int. Cl.
*H02H 9/04* (2006.01)
*H02H 3/20* (2006.01)

(52) U.S. Cl.
USPC .............................. 361/56; 361/91.1; 257/355

(58) Field of Classification Search
CPC . H01L 27/0277; H01L 23/60; H01L 27/0255; H02H 9/041; H02H 3/20; H02H 3/44; H02H 9/04
USPC ................................... 361/56, 91.1; 257/355
See application file for complete search history.

(56) References Cited

U.S. PATENT DOCUMENTS

| | | | | |
|---|---|---|---|---|
| 4,928,157 | A * | 5/1990 | Matsunaga et al. | 257/362 |
| 5,940,258 | A * | 8/1999 | Duvvury | 361/56 |
| 6,411,480 | B1 * | 6/2002 | Gauthier et al. | 361/56 |
| 6,657,835 | B2 * | 12/2003 | Ker et al. | 361/56 |
| 6,873,017 | B2 * | 3/2005 | Cai et al. | 257/355 |
| 7,579,881 | B2 * | 8/2009 | Bach | 327/108 |
| 7,719,813 | B2 * | 5/2010 | Chen | 361/111 |
| 8,525,265 | B2 * | 9/2013 | Ker et al. | 257/355 |

* cited by examiner

*Primary Examiner* — Rexford Barnie
*Assistant Examiner* — Zeev V Kitov
(74) *Attorney, Agent, or Firm* — Horizon IP Pte. Ltd.

(57) ABSTRACT

Protecting a gate dielectric is achieved with a gate dielectric protection circuit coupled to a transistor at risk. The protection circuit is activated to reduce the voltage across the gate dielectric ($V_{DIFF}$) to below its breakdown voltage ($V_{BD}$). The protection circuit is activated when an ESD event is detected. The protection circuit provides a protection or ESD bias to reduce $V_{DIFF}$ below $V_{BD}$.

20 Claims, 7 Drawing Sheets

GATE DIELECTRIC PROTECTION

BACKGROUND

High voltage buildup occurs at input/output (I/O) pads of an integrated circuit (IC) during an electrostatic discharge (ESD) event. This high voltage buildup may cause damage to gate dielectrics of input stage transistors. For example, if the gate to substrate voltage at the input stage transistor is greater than the breakdown voltage ($V_{BD}$) of the gate dielectric, than transistor may be rendered defective.

Conventional techniques for protecting gate dielectrics include the use of a clamping circuit to limit the voltage seen across the gate dielectric. However, conventional techniques are not very effective in protecting gate dielectrics for newer technologies. This is because the triggering voltage of the clamping circuit is greater than $V_{BD}$ of the gate dielectrics. For example, by the time the clamping circuit is switched on, the voltage across the gate dielectric is already greater than $V_{BD}$.

It is desirable to provide gate dielectric protection which adequately prevents the voltage across the gate dielectric to be above $V_{BD}$.

SUMMARY

Embodiments generally relate to semiconductor devices and methods for forming a device. In one embodiment, a device is disclosed. The device includes a transistor having a gate on a substrate. The gate includes a gate electrode over a gate dielectric. The device also includes a gate dielectric protection module coupled to the transistor. The gate dielectric protection module, when activated, provides a protection bias to reduce a voltage difference between the gate and substrate ($V_{DIFF}$) to below a breakdown voltage ($V_{BD}$) of the gate dielectric.

In another embodiment, a method for forming a device is presented. The method includes forming a transistor having a gate on a substrate. The gate includes a gate electrode over a gate dielectric. The method also includes forming a gate dielectric protection module coupled to the transistor. The gate dielectric protection module, when activated, provides a protection bias to reduce a voltage difference between the gate and substrate ($V_{DIFF}$) to below a breakdown voltage ($V_{BD}$) of the gate dielectric.

In yet another embodiment, a method for protecting gate dielectric is disclosed. The method includes providing a transistor at risk. A protection module coupled to the transistor at risk is formed. The protection module is activated to provide a protection bias to reduce a voltage difference between a gate of the transistor at risk and a substrate ($V_{DIFF}$) to below a breakdown voltage ($V_{BD}$) of a gate dielectric of the transistor at risk.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. In one embodiment, the devices include a protection module. The protection module, for example, is activated during an ESD event to protect a gate dielectric of a transistor at risk from damage from the ESD event. The devices, for example, may be any type of semiconductor devices, such as integrated circuits (ICs). The ICs can be incorporated into or used with, for example, electronic products, computers, cell phones, and personal digital assistants (PDAs). The devices may also be incorporated into other types of products.

Figure 1:
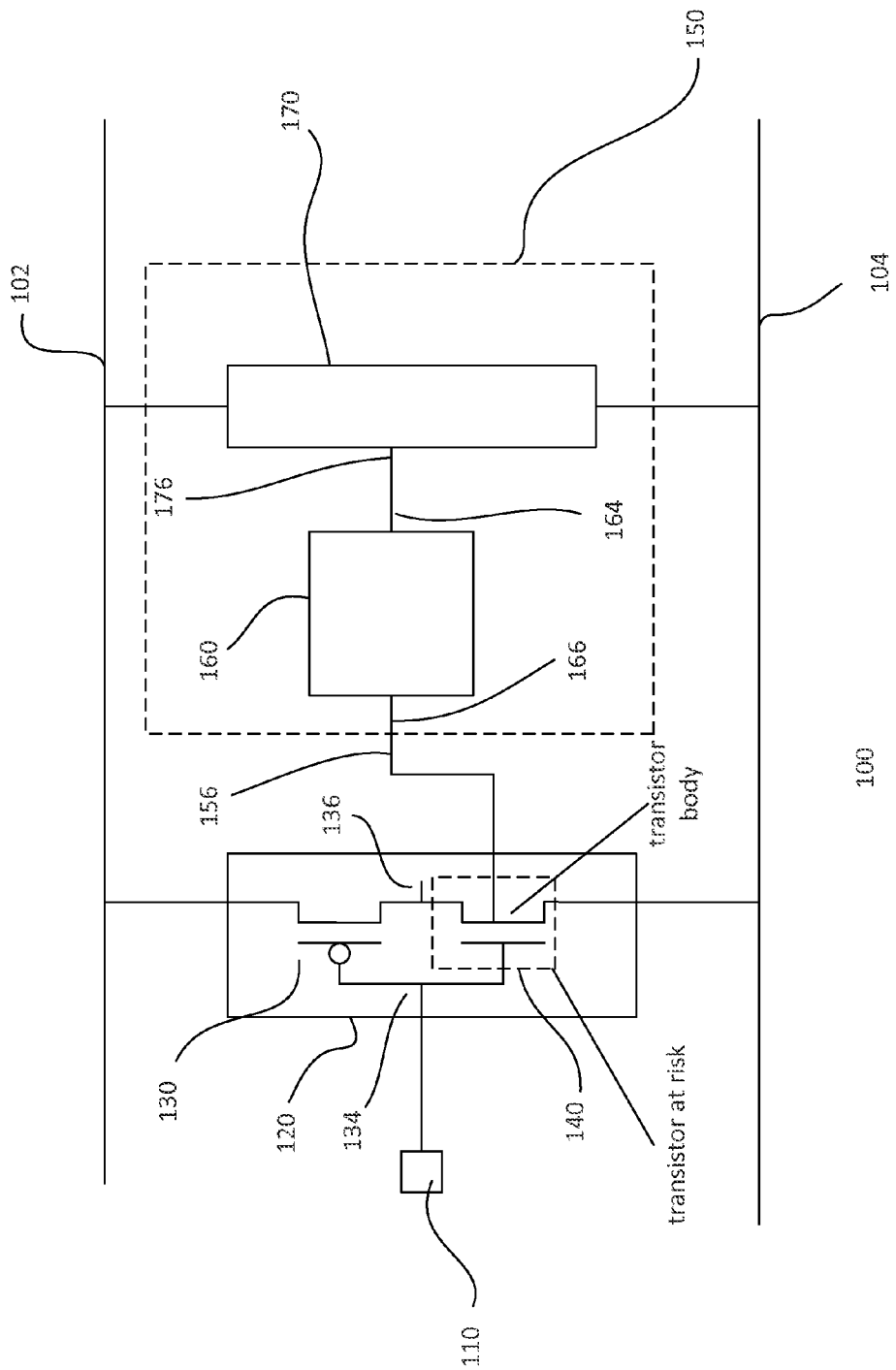
FIG. 1 shows a block diagram of a portion of an embodiment of a device.

FIG. 1 shows a portion of an embodiment of a device 100. As shown, the portion includes an internal circuit or cell 120. The cell is coupled between first and second power rails 102 and 104. The first power rail may be $V_{DD}$ (operating voltage) and the second power rail may be $V_{SS}$ (ground). Other configurations of power rails may also be useful. The cell is coupled to a pad 110 of the device. The pad, in one embodiment, is an I/O pad. The I/O receives an I/O signal. For example, the I/O signal may be an input signal or a bi-directional signal. Other types of pads may also be useful.

In one embodiment, the cell includes an inverter having first and second transistors 130 and 140 coupled in series between the power rails. Other types of cells may also be useful. The transistors are metal oxide semiconductor (MOS) transistors. In one embodiment, the first transistor is a p-type transistor and the second transistor is a n-type transistor. A first terminal of the first transistor is coupled to the first power rail while a second terminal of the first transistor is coupled to a second terminal of the second transistor. A first terminal of the second transistor is coupled to the second power rail. The body of the first transistor is coupled to the first power rail and the body of the second transistor is coupled to the second power rail.

An input 134 of the inverter is commonly coupled to the gates of the transistors. An output 136 of the inverter is commonly coupled to the second terminals of the transistors. The inverter, in one embodiment, is configured as a receiver. For example, the pad is coupled to the input of the inverter. The output is coupled to other internal circuitry (not shown). Other configurations of the inverter may also be useful.

An ESD event may occur at the pad. The ESD event, for example, may be the result of an ESD or trigger stimulus, such as ESD or energy pulse, provided at the pad. Other types of trigger stimuli which cause an ESD event may also be useful. The ESD stimulus may be provided at the pad inadvertently or accidentally. Alternatively, the ESD stimulus may be intentionally provided at the pad, such as in the case of an ESD test.

The ESD event puts a transistor of the cell at risk. For example, the ESD event may cause damage to the gate dielectric of the transistor at risk, rendering the cell defective. In one embodiment, the ESD event puts the second transistor of the inverter at risk. For example, the ESD event puts the n-type MOS transistor at risk. In other cases, the ESD event may put other types of transistor at risk.

In one embodiment, a gate dielectric protection module 150 is provided. The protection module includes a protection output 156 which is coupled to the cell. In one embodiment, the protection output is coupled to a body of the transistor at risk. In the case of an inverter, the protection output is coupled to the body of the second transistor. For example, the protection output is coupled to the body of the n-type transistor.

The protection module, in one embodiment, generates an inactive protection signal at the protection output under normal condition (no ESD event). The inactive protection signal enables the cell to operate in the normal condition. The inactive protection signal, for example, does not affect the normal bias voltage applied to the body of the transistor at risk. The inactive protection signal, in one embodiment, provides a normal bias voltage for the body of the transistor at risk. In one embodiment, the inactive protection signal provides a normal bias of 0V or ground. Providing other normal bias voltages may also be useful. The normal bias voltage, for example, may depend on the type of transistor at risk.

In the case of an ESD event, the protection module generates an active protection signal. The active protection signal provides an ESD bias to the body of the transistor at risk. The ESD bias reduces the voltage differential between the gate of the transistor at risk and the substrate ($V_{DIFF}$). For example, the ESD bias reduces $V_{DIFF}$ between the gate and body of the transistor at risk. In one embodiment, the ESD bias is sufficient to ensure that $V_{DIFF}$ is less than breakdown voltage ($V_{BD}$) of the gate dielectric of the transistor at risk. In one embodiment, $V_{DIFF}$ is at least 5-10% less than $V_{BD}$. For example, if $V_{BD}$ is about 3.7V, then $V_{DIFF}$ should be less than 3.5V.

In one embodiment, the ESD bias increases the substrate voltage ($V_{SUB}$) or body of the transistor. Increasing $V_{SUB}$ reduces $V_{DIFF}$ to below $V_{BD}$. The ESD bias, for example, may be equal to about 0.5-1V. Providing other ESD bias voltages for biasing $V_{SUB}$ may also be useful.

As described, the transistor at risk is a n-type transistor. In other embodiments, the transistor at risk may be a p-type transistor. For a p-type transistor, the normal bias is $V_{DD}$. The ESD bias, for example, may be equal to about 0.5-1V below $V_{DD}$. In one embodiment, the protection module is used to pull the n-well potential of the p-type transistor down by 0.5-1V. Other types of normal and ESD biases may also be useful.

The protection module, in one embodiment, includes an ESD sensing circuit 170 and a biasing circuit 160. The ESD sensing circuit includes a sensing output 176 which is coupled to a biasing input 164 of the biasing circuit. The biasing circuit includes a biasing output 166, which in one embodiment, is the protection output. Other configurations of biasing output and protection output may also be useful. The protection output provides a signal which is used to bias the body of the transistor at risk.

The function of the ESD sensing circuit is to sense the occurrence of an ESD event. Under normal condition (no ESD event), the ESD sensing circuit generates an inactive ESD event signal at the sensing output. In one embodiment, the inactive ESD event signal is a logic 1 signal. On the other hand, when an ESD event is sensed, the ESD sensing circuit generates an active ESD event signal at the sensing output. In one embodiment, the active ESD event signal is a logic 0 signal. The use of other types of active and inactive ESD event signals may also be useful.

The biasing circuit, when activated, provides the ESD bias to the substrate to reduce $V_{DIFF}$. For example, the activated biasing circuit provides the ESD bias to the body of the transistor at risk to reduce $V_{DIFF}$. The biasing circuit, when inactivated, does not affect normal operation of the cell. For example, the inactivated biasing circuit provides a normal bias to the body of the transistor at risk.

In one embodiment, an inactive ESD event signal at the biasing input renders the biasing circuit inactive. This causes the biasing circuit to generate an inactive bias signal at the biasing output. The inactive bias signal is provided at the protection output. The inactive bias signal, in one embodiment, does not affect the normal bias voltage applied to the body of the transistor at risk. The inactive bias signal, in one embodiment, is a logic 0 signal or ground. The inactive bias signal provides a 0V bias to the body of the transistor at risk. Other types of inactive bias signals may also be useful.

An active ESD event signal activates the biasing circuit to generate an active bias signal at the biasing output. In one embodiment, the active bias signal is provided at the protection output. The active bias signal, in one embodiment, is the ESD bias which reduces $V_{DIFF}$. In one embodiment, the ESD bias is provided to the body of the transistor at risk. The ESD bias is sufficient to ensure $V_{DIFF}$ to be less than $V_{BD}$ during an ESD event. The ESD bias, for example, may be equal to about $V_{DD}$. Providing other ESD bias voltages for biasing $V_{SUB}$ may also be useful.

The portion of the device may also include an ESD protection circuit (not shown). The ESD protection circuit is coupled to the pad. Various types of ESD protection circuits may be employed. In some embodiments, the ESD protection circuit may be coupled to the power rails (e.g., $V_{DD}$ and $V_{SS}$) and pad. In other embodiments, the ESD protection circuit may be coupled to the second power rail (e.g., $V_{SS}$). When an ESD event occurs, the ESD protection circuit provides a current path from the pad to ground to dissipate the ESD current.

As described, the cell includes one transistor at risk. However, it is understood that a cell may include more than one transistor at risk. Furthermore, it is understood that there may be other cells in the device with transistors at risk. Transistors at risk are provided with an ESD bias. In one embodiment, a biasing circuit may be employed for each transistor at risk. The biasing circuits may share a common sensing circuit. The ESD bias may be the same for the transistors at risk. Providing different ESD biases for different types of transistors may also be useful. Other configurations of biasing and sensing circuits as well as ESD biases may also be useful.

Figure 2A:
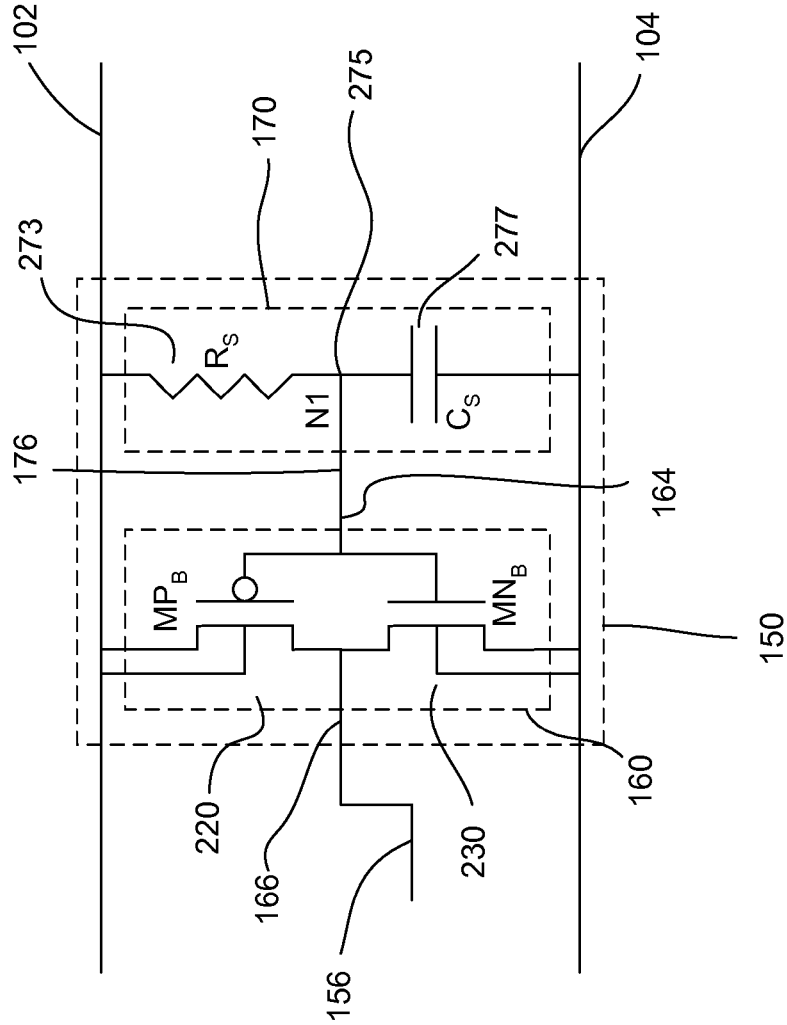
FIGS. 2a-b show embodiments of gate dielectric protection modules.

FIG. 2a shows an embodiment of a gate dielectric protection module 150. The protection module includes a protection output 156. In one embodiment, the protection output is coupled to a body of a transistor at risk (not shown). For example, the protection output may be coupled to the body of the n-type transistor of an inverter, as shown in FIG. 1.

The protection module, in one embodiment, includes an ESD sensing circuit 170 and a biasing circuit 160. In one embodiment, the ESD sensing circuit and biasing circuit are coupled in parallel between first and second power rails 102 and 104. The first power rail may be $V_{DD}$ (operating voltage) and the second power rail may be $V_{SS}$ (ground). Other configurations of power rails may also be useful. The ESD sensing circuit includes a sensing output 176 which is coupled to a biasing input 164 of the biasing circuit. The biasing circuit includes a biasing output 166, which in one embodiment, is the protection output. Other configurations of biasing output and protection output may also be useful. The protection output provides a signal which is used to bias the body of the transistor at risk.

The function of the ESD sensing circuit is to sense the occurrence of an ESD event. In one embodiment, the sensing circuit includes a resistive element ($R_S$) 273 and a capacitive element ($C_S$) 277 coupled in series between the first and second power rails. The first power rail is coupled to $R_S$ and $C_S$ is coupled to the second power rail. In one embodiment, $R_S$ has a first terminal coupled to the first power rail and $C_S$ has a first terminal coupled to the second power rail. The second terminals of the $R_S$ and $C_S$ are commonly coupled to each other, forming a common node 275 or node $N_1$. A sensing output 176 is coupled to node $N_1$. The RC time constant τ of the sensing circuit is selected to sense the ESD event. For example, the RC time constant should be able to sense the ESD current. In one embodiment, τ is about 1.0-2.0 μs. Other values of τ may also be useful.

The biasing circuit, in one embodiment, includes a first transistor 220 and a second transistor 230 which are coupled in series between the power rails. The first transistor is a p-type MOS transistor ($MP_B$) and the second transistor is a n-type MOS transistor ($MN_B$). A first terminal of the first transistor is coupled to the first power rail while a second terminal of the first transistor is coupled to a second terminal of the second transistor. A first terminal of the second transistor is coupled to the second power rail. The body of the first transistor is coupled to the first power rail and the body of the second transistor is coupled to the second power rail.

The gates of the transistors are commonly coupled to a biasing input 164. The biasing input is coupled to the sensing output of the sensing circuit. A biasing output 166 is commonly coupled to the second terminals of the first and second transistors. The biasing output, in one embodiment, becomes or is coupled to the protection module output.

Under normal condition (no ESD event), the sensing circuit generates an inactive ESD event signal at the sensing output. In one embodiment, $C_S$ is non-conductive under normal condition. This results in node $N_1$ being at a logic 1 or high potential (e.g., potential of the first power rail or about $V_{DD}$). The logic 1 signal at $N_1$ serves as the inactive ESD event signal at the sensing output. The inactive ESD event signal is provided to the biasing input. The logic 1 signal causes $MP_B$ to be switched off and $MN_B$ to be switched on, resulting in the biasing output being at a logic 0 or low potential (e.g., potential of the second power rail or $V_{SS}$). The logic 0 signal is the inactive bias signal. The logic 0 signal is the normal bias to the transistor at risk, which does not affect its operation.

When an ESD event is sensed, the sensing circuit generates an active ESD event signal at the sensing output. In one embodiment, when an ESD event occurs, current flows through $C_S$. This results in node $N_1$ being at a logic 0 or low potential (e.g., potential of the second power rail or about $V_{SS}$). The logic 0 signal at $N_1$ serves as the active ESD event signal at the sensing output. The active ESD event signal is provided to the biasing input. The logic 0 signal causes $MP_B$ to be switched on and $MN_B$ to be switched off. With $MP_B$ on and $MN_B$ off, the biasing output is coupled to the first power rail, producing a logic 1 or high potential (e.g., potential of the first power rail or $V_{DD}$) signal at the biasing output. The logic 1 signal is the active bias signal which provides the ESD bias to the body of the transistor at risk.

The ESD bias reduces $V_{DIFF}$. In one embodiment, the ESD bias reduces $V_{DIFF}$ by increasing $V_{SUB}$. For example, current flows into the substrate from the first power rail to the body of the transistor at risk when $MP_B$ is switched on. The current increases $V_{SUB}$ of the transistor at risk. The magnitude of the current flowing into the body of the transistor at risk, in one embodiment, is about 1 mA. Providing currents of other magnitude may also be useful.

Figure 2B:
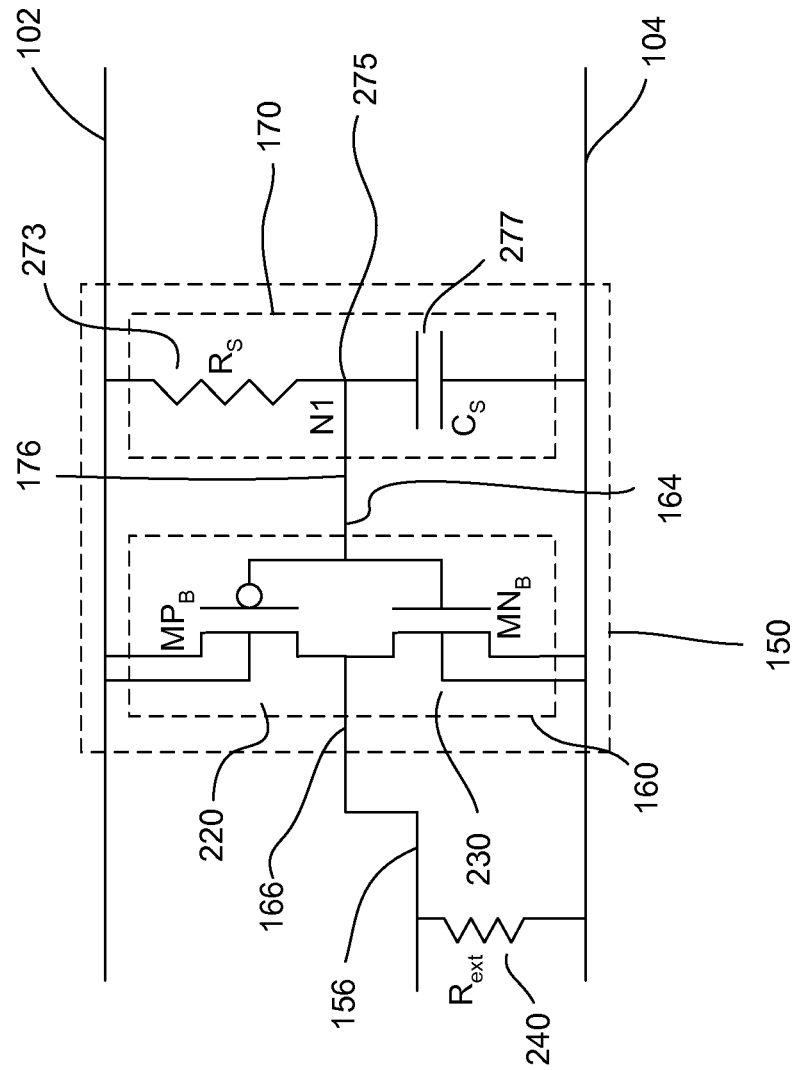

FIG. 2b shows another embodiment of a gate dielectric protection module 150. The protection module is similar to that described in FIG. 2a. As such, common elements may not be described or described in detail. As shown, a resistor ($R_{ext}$) 240 is provided at the protection output 156. The resistor, for example, may be formed from polysilicon. Other types of resistors may also be useful. In one embodiment, $R_{ext}$ is coupled between the protection output and the second power rail. For example, $R_{ext}$ is coupled between the protection output and $V_{SS}$. In one embodiment, the protection output is coupled to a body of a transistor at risk (not shown). For example, the protection output may be coupled to the body of the n-type transistor of an inverter, as shown in FIG. 1.

Under normal condition, $MP_B$ is switched off while $MN_B$ is switched on, resulting in the biasing output being at a logic 0. Since the biasing output is at logic 0, no current flows through $R_{ext}$. With no voltage drop across $R_{ext}$, the normal bias applied to the body of the transistor at risk is not affected. On the other hand, when the biasing output is at logic 1, current flows through $R_{ext}$. This creates a voltage across $R_{ext}$. The voltage across $R_{ext}$ increases $V_{SUB}$, which reduces $V_{DIFF}$. The amount of voltage across $R_{ext}$ depends on the amount of current and size of the resistor $R_{ext}$. The voltage across $R_{ext}$ reduces $V_{DIFF}$ sufficiently below $V_{BD}$. In one embodiment, the voltage across $R_{ext}$ is about 0.5-1V. The current at the biasing output from $MP_B$ may be about 1 mA. As such, $R_{ext}$ is about 10-50 kΩ. Providing other currents and resistors may also be useful.

FIGS. 3a-d show portions of embodiments of a device 300. As shown, the portion includes an internal circuit or cell 120. The cell is coupled between first and second power rails 102 and 104. The first power rail may be $V_{DD}$ (operating voltage) and the second power rail may be $V_{SS}$ (ground). The cell is coupled to a pad 110 of the device. The pad, for example, may be an I/O pad for an I/O signal.

In one embodiment, the cell includes an inverter having first and second transistors 130 and 140 coupled in series between the power rails. Other types of cells may also be useful. The first transistor is a p-type transistor and the second transistor is a n-type transistor. A first terminal of the first transistor is coupled to the first power rail while a second terminal of the first transistor is coupled to a second terminal of the second transistor. A first terminal of the second transistor is coupled to the second power rail. The body of the first transistor is coupled to the first power rail and the body of the second transistor is coupled to the second power rail. An input 134 of the inverter is commonly coupled to the gates of the transistors. An output 326 of the inverter is commonly coupled to the second terminals of the transistors.

As shown, the pad is coupled to the input of the inverter. The output is coupled to internal circuitry (not shown) of the device. In other embodiments, the pad is coupled to the output of the inverter. The input of the inverter is coupled to internal circuitry (not shown) of the device.

In one embodiment, a body of the second transistor is coupled to an output of a gate dielectric protection module, as described in FIG. 1 and FIGS. 2a-b. The protection module is activated to provide an ESD bias to the body of the second transistor when an ESD event is detected. This reduces $V_{DIFF}$ to ensure that it is below $V_{BA}$.

In one embodiment, an ESD protection circuit 390 is provided. The ESD protection circuit is coupled to the pad. Various types of ESD protection circuits may be employed. In some embodiments, the ESD protection circuit may be coupled to the power rails (e.g., $V_{DD}$ and $V_{SS}$) and pad. In other embodiments, the ESD protection circuit may be coupled to the second power rail (e.g., $V_{SS}$). When an ESD event occurs, the ESD protection circuit provides a current pad from the pad to ground to dissipate the ESD current.

Figure 3A:
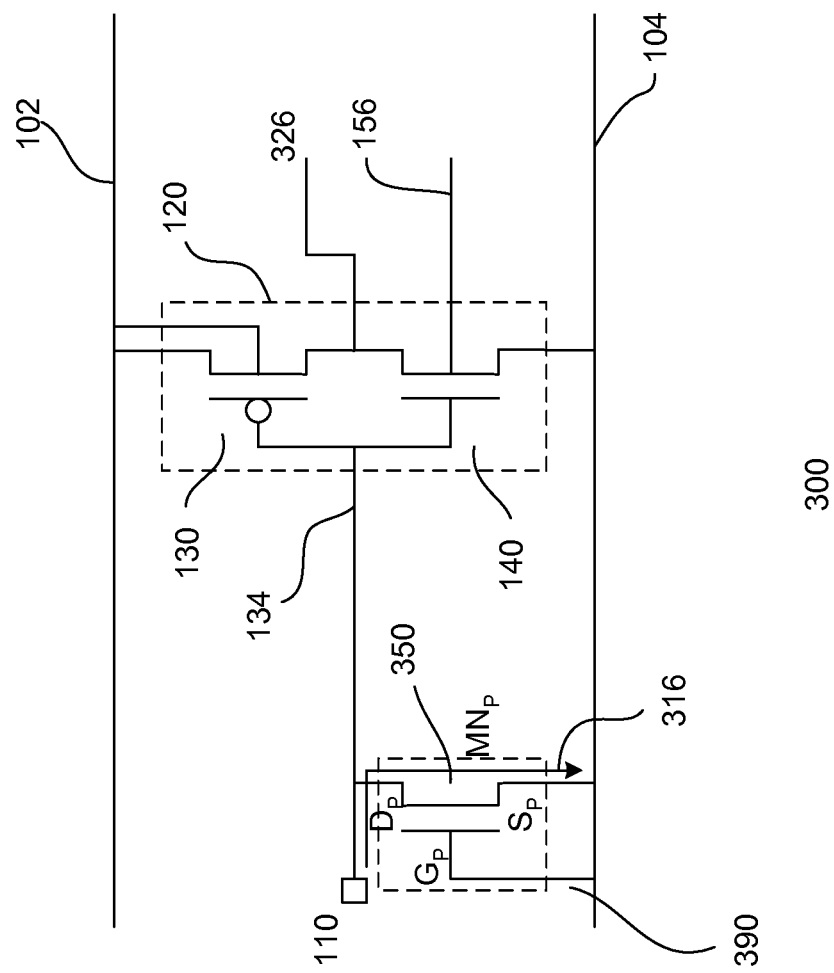
FIGS. 3a-d show various embodiments of ESD protection circuits.

As shown in FIG. 3a, the ESD protection circuit includes a grounded gate n-type MOS transistor $MN_P$ 350 having a drain terminal $D_P$ coupled to the pad and a source terminal $S_P$ and a gate terminal $G_P$ commonly coupled to $V_{SS}$. The transistor $MN_P$ creates a parasitic bipolar junction transistor (BJT) in the substrate. The BJT is a NPN BJT formed by junctions of $D_P$, substrate (P-well) and $S_P$. For example, the $D_P$-substrate interface forms a first p-n junction and $S_P$-substrate forms a second p-n junction of the NPN BJT.

Under normal operational conditions (e.g., no ESD event), the grounded gate ensures that $MN_P$ is switched off due to the first and second p-n junctions of the BJT being reverse biased. The signal at the pad is unaffected with $MN_P$ switched off, enabling the cell to operate under normal conditions. An ESD event increases the voltage at $D_P$ ($V_{DP}$), allowing current to flow which increases the substrate potential (e.g., base of parasitic BJT or $V_B$). When $V_B$ is sufficiently high, the parasitic BJT is switched on. For example, when $V_B$ exceeds the trigger voltage $V_{TP}$, $MN_P$ is switched on. This causes avalanche breakdown of $MN_P$, creating a current path 316 from the pad to $V_{SS}$ to dissipate the ESD current.

Figure 3B:
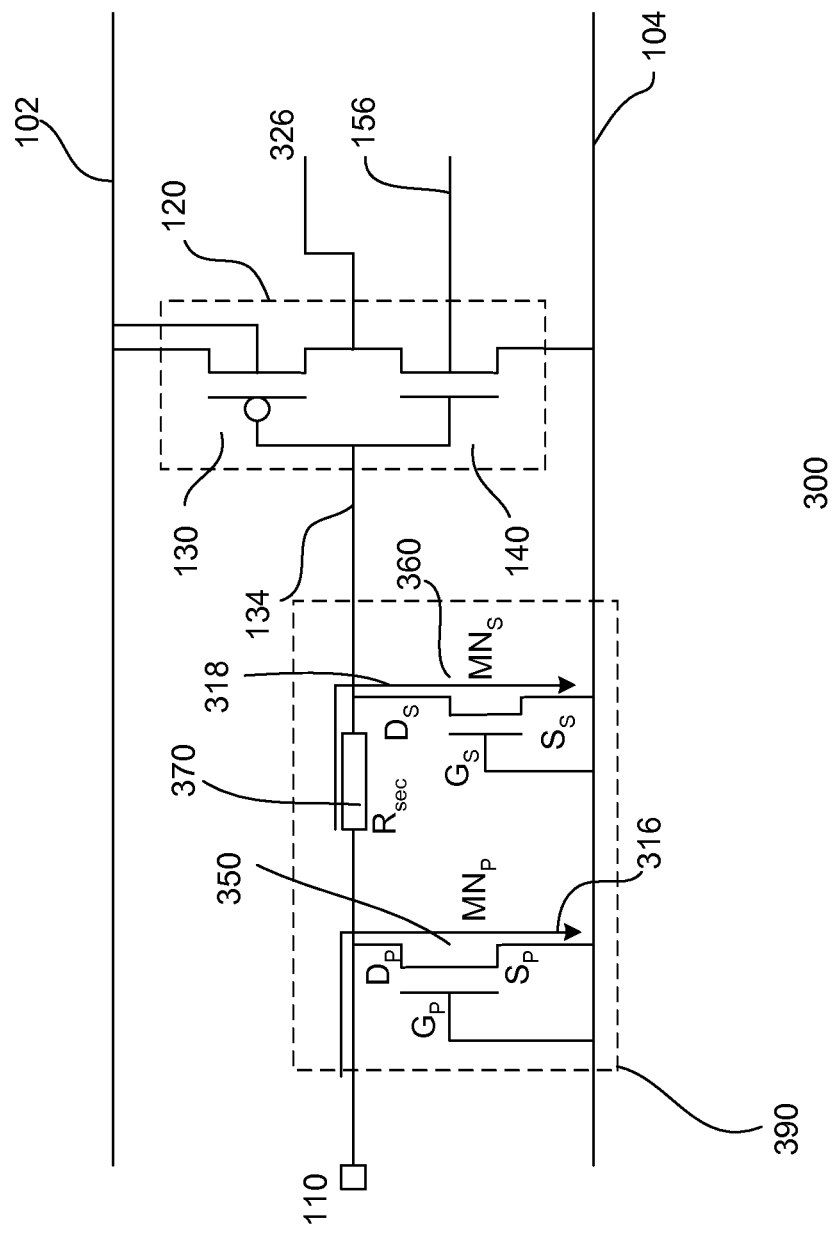

FIG. 3b shows another embodiment of an ESD protection circuit 390. The protection circuit is similar to the ESD protection circuit described in FIG. 3a. As such, similar elements may not be described or described in detail. The ESD protection circuit includes a first grounded gate n-type MOS transistor ($MN_P$) 350 and a second grounded gate n-type MOS transistor ($MN_S$) 360 coupled in parallel between the pad 110 and second power rail or ground ($V_{SS}$).

In one embodiment, $MN_P$ includes a drain terminal $D_P$ coupled to the pad and a source terminal $S_P$ and a gate terminal $G_P$ commonly coupled to $V_{SS}$. Similarly, $MN_S$ has a drain terminal $D_S$ coupled to the pad and a source terminal $S_S$ and a gate terminal $G_S$ commonly coupled to $V_{SS}$. A resistor $R_{sec}$ 370 is coupled between the drain terminals of $MN_P$ and $MN_S$. The resistor, for example, may be formed from polysilicon. In one embodiment, the resistor is formed from unsilicided silicon.

Under normal operational conditions (e.g., no ESD event), the grounded gates ensure that $MN_P$ and $MN_S$ are switched off. This is because the first and second p-n junctions of the BJTs are reverse biased. The signal at the pad is unaffected with $MN_P$ and $MN_S$ switched off, enabling the cell to operate under normal conditions.

In the case of an ESD event, the voltages at $D_P$ ($V_{DP}$) and $D_S$ ($V_{Ds}$) increase, allowing current to flow which increases the substrate potential (e.g., base of parasitic BJTs or $V_{BP}$ and $V_{BS}$). When $V_{BP}$ and $V_{BS}$ are sufficiently high, the parasitic BJTs are switched on. For example, when $V_{BP}$ and $V_{BS}$ exceed the trigger voltages $V_T$ of $MN_P$ and $MN_S$, the transistors are switched on. This causes avalanche breakdown of transistors, creating first and second current paths 316 and 318 from the pad to $V_{SS}$ to dissipate the ESD current. The current through $R_{Sec}$ in the second current path results in a voltage drop $V_{Rsec}$. The voltage drop clamps the input voltage at the transistor at risk to $V_{Rsec}$.

Figure 3C:
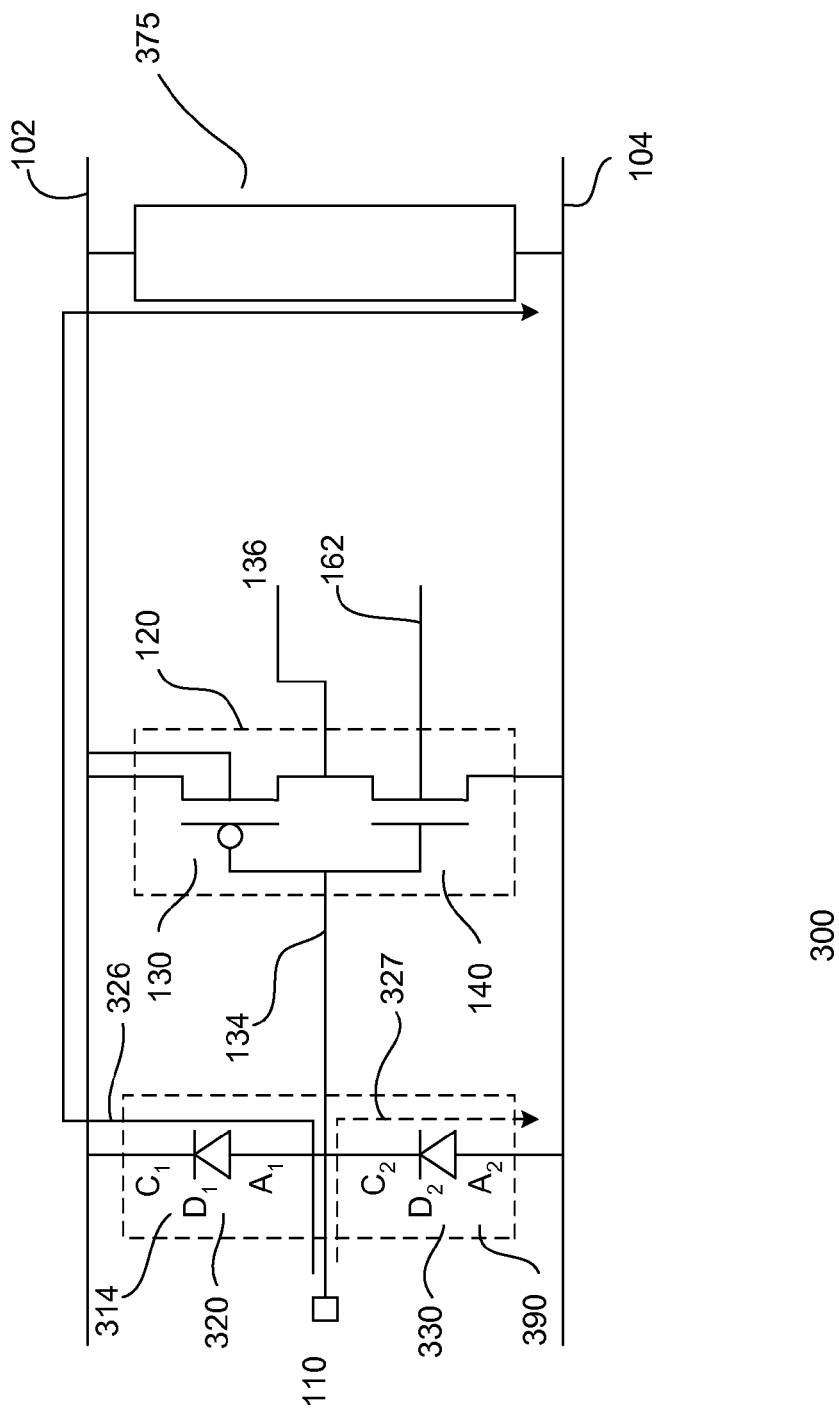

Referring to FIG. 3c, an alternative embodiment of an ESD protection circuit 390 is shown. The ESD protection circuit is coupled to the pad 110 and first and second power rails 102 and 104. The ESD protection circuit includes a diode pair 314 with a first diode ($D_1$) 320 and a second diode ($D_2$) 330 being serially coupled between the power rails. In one embodiment, a cathode $C_1$ of $D_1$ is coupled to the first power rail ($V_{DD}$) and an anode $A_2$ of $D_2$ is coupled to the second power rail ($V_{SS}$). An anode $A_1$ of $D_1$ and a cathode $C_2$ of $D_2$ are commonly coupled to the pad. The ESD protection circuit, for example, is a rail based ESD protection circuit.

In one embodiment, a clamp circuit 375 is provided. The clamp circuit is coupled between the first and second power rails. The clamp circuit is normally deactivated. When activated by an ESD event, a current path between the power rails is created. The clamping circuit may be controlled by an ESD trigger circuit. For example, the trigger circuit generates an inactive trigger output under normal conditions and an active trigger output signal when an ESD event occurs.

The clamp circuit, in one embodiment, includes a clamping transistor, such as a n-type MOS transistor. The clamping transistor is activated or switched on by a trigger circuit when an ESD event occurs. Switching on the clamping transistor creates a current path between the power rails. The trigger circuit, for example, may be the sensing circuit of the protection module, as described in FIGS. 2a-b. Providing other types of trigger circuits may also be useful.

Under normal operational conditions, the diodes are reversed biased. Additionally, the clamping circuit is deactivated. The signal at the pad is unaffected with the diodes reversed biased, enabling the cell to operate under normal conditions.

In one embodiment, an ESD event causes either $D_1$ or $D_2$ to be forward biased, creating a current path to one of the power rails. For a negative pulse ESD event, $D_2$ is forward biased and $D_1$ is reversed biased. This creates a current path 327 to $V_{SS}$ for dissipating the ESD current. In the case of a positive pulse ESD event, $D_2$ is reversed biased and $D_1$ is forward biased. Furthermore, a current path exists between the power rails through the clamping circuit since it is activated during an ESD event. As such, a current path 326 to $V_{SS}$ is created via $V_{DD}$ to dissipate the ESD current.

Figure 3D:
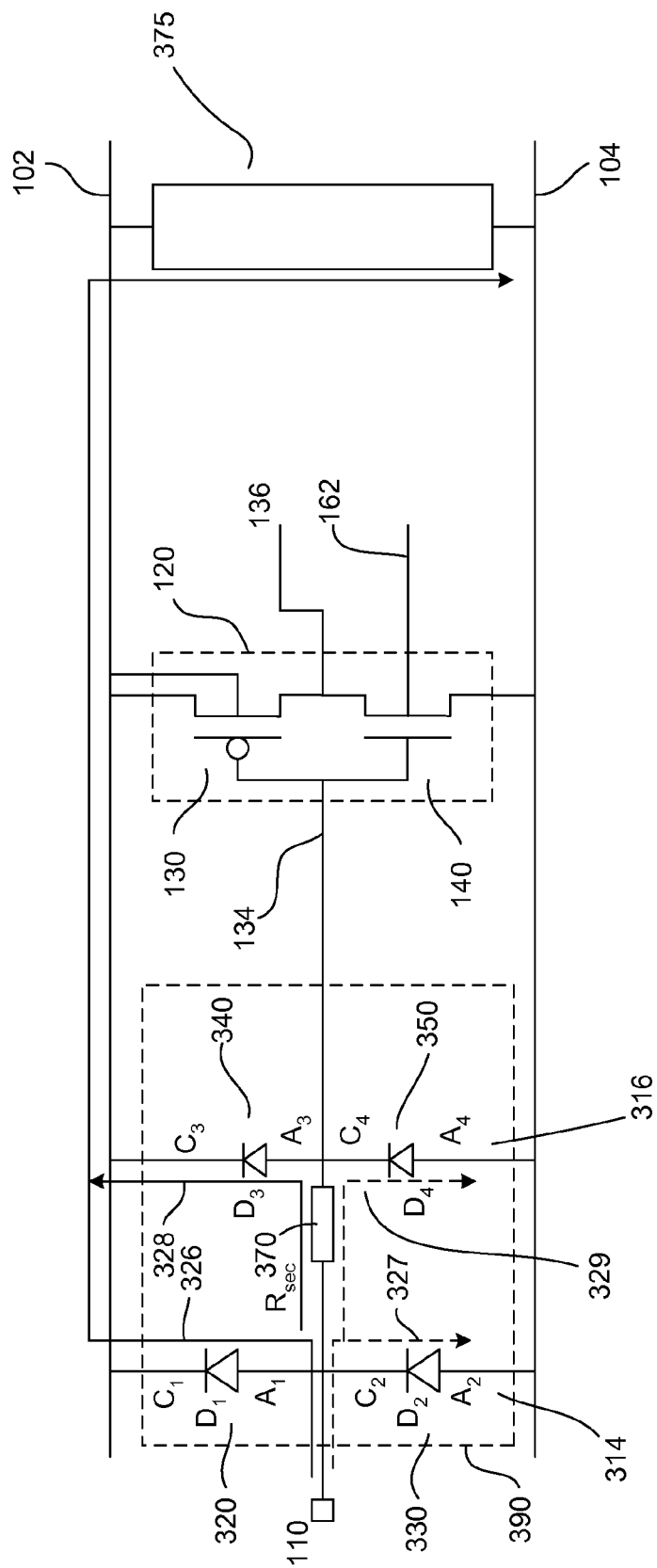

Another embodiment of an ESD protection circuit 390 is shown in FIG. 3d. The ESD protection circuit is similar to the rail based ESD protection circuit of FIG. 3c. As such, common elements may not be described or described in detail. The ESD protection circuit is coupled to the first and second power rails 102 and 104 and pad 110. In one embodiment, the ESD protection circuit includes first and second diode pairs 314 and 316. The first and second diode pairs are coupled in parallel between the first and second power rails. The first and second diode pairs are also coupled to the pad 110.

In one embodiment, the first diode pair has a first diode ($D_1$) 320 and a second diode ($D_2$) 330 being serially coupled between the power rails. A cathode $C_1$ of $D_1$ is coupled to the first power rail ($V_{DD}$) and an anode $A_2$ of $D_2$ is coupled to the second power rail ($V_{SS}$). An anode $A_1$ of $D_1$ and a cathode $C_2$ of $D_2$ are commonly coupled to the pad. The second diode pair, similarly, has a first diode ($D_3$) 340 and a second diode ($D_4$) 350 being serially coupled between the power rails. A cathode $C_3$ of $D_3$ is coupled to the first power rail ($V_{DD}$) and an anode $A_4$ of $D_4$ is coupled to the second power rail ($V_{SS}$). An anode $A_3$ of $D_3$ and a cathode $C_4$ of $D_4$ are commonly coupled to the pad. A resistor ($R_{sec}$) 370 is coupled between the common terminals of $D_1$ and $D_2$ and common terminals of $D_3$ and $D_4$. The resistor, for example, may be formed from polysilicon. In one embodiment, the resistor is formed from unsilicided silicon.

In one embodiment, a clamp circuit 375 is provided. The clamp circuit is coupled between the first and second power rails. The clamp circuit is normally deactivated. When the clamp circuit is activated by an ESD event, a current path between the power rails is created. The clamping circuit may be controlled by an ESD trigger circuit. For example, the trigger circuit generates an inactive trigger output under normal conditions and an active trigger output signal when an ESD event occurs.

Under normal operational conditions, the diodes of the ESD protection circuit are reversed biased. Additionally, the clamping circuit is deactivated. The signal at the pad is unaffected with the diodes reversed biased, enabling the cell to operate under normal conditions.

In one embodiment, an ESD event causes either $D_1$ and $D_3$ or $D_2$ and $D_4$ to be forward biased, creating a current path to one of the power rails. For a negative pulse ESD event, $D_2$ and $D_4$ are forward biased and $D_1$ and $D_3$ are reversed biased. This creates current paths 327 and 329 to $V_{SS}$ for dissipating the ESD current. In the case of a positive pulse ESD event, $D_2$ and $D_4$ are reversed biased and $D_1$ and $D_3$ are forward biased. Furthermore, a current path exists between the power rails through the clamping circuit since it is activated during an ESD event. As such, first and second current paths 326 and 328 to $V_{SS}$ are created via $V_{DD}$ to dissipate the ESD current. The current through $R_{sec}$ in the second current path results in a voltage drop $V_{Rsec}$. The voltage drop clamps the input voltage at the transistor at risk to $V_{Rsec}$.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
    an input/output (I/O) pad; and
    an internal circuit, a gate dielectric protection module and an ESD protection circuit, wherein the internal circuit, the gate dielectric protection module and the ESD protection circuit are separate and distinct circ its, and wherein
        the internal circuit is coupled between a first power rail which is a high power rail and a second power rail which is a ground rail and the internal circuit is coupled to the I/O pad, the internal circuit comprises a first transistor which is a transistor at risk having a transistor body and a gate, the gate includes a gate electrode over a gate dielectric, wherein the transistor at risk operates normally under normal operational bias voltage when no ESD event and is susceptible to damage and requires protection during an ESD event,
        the gate dielectric protection module is coupled to the transistor body of the transistor at risk which functions to protect the gate dielectric of the transistor at risk of the internal circuit during an ESD event, wherein the gate dielectric protection module, when activated, provides a protection bias to the transistor body of the transistor at risk to reduce a voltage difference between the gate of the transistor at risk. and substrate ($V_{DIFF}$) of the transistor at risk to below a breakdown voltage ($V_{BD}$) of the gate dielectric of the transistor at risk, and
        the ESD protection circuit is switched off during no ESD event and provides a current path from the first power rail to the ground rail to dissipate an ESD current during an ESD event.

2. The device of claim 1 wherein the gate dielectric protection module provides the protection bias to the transistor body of the transistor at risk to increase the substrate voltage ($V_{SUB}$) to reduce $V_{DIFF}$ to at least 5% below $V_{BD}$.

3. The device of claim 1 wherein the gate dielectric protection mod provides the protection bias to increase the substrate voltage ($V_{SUB}$) to reduce $V_{DIFF}$ below $V_{BD}$.

4. The device of claim 1 wherein the gate dielectric protection module provides the protection bias to reduce $V_{DIFF}$ to at least 5% below $V_{BD}$.

5. The device of claim 1 wherein the gate protection module comprises:
    a sensing circuit for detecting an ESD event; and
    a biasing circuit coupled to the transistor at risk, wherein the sensing circuit and biasing circuit are coupled in parallel between the first and second power rails,
    the sensing circuit comprises a sensing output which is coupled to a biasing input of the biasin circuit, the sensing circuit activates the biasing circuit when an ESD event is detected to provide the protection bias.

6. The device of claim 5 wherein the sensing circuit comprises:
    a sensing resistor coupled in series with a sensing capacitor disposed between the first and second power rails, wherein the sensing resistor is coupled to the first power rail and the sensing capacitor is coupled to the second power rail; and
    the sensing circuit output is coupled to the biasing circuit, the sensing circuit output is disposed between a common terminal of the sensing resistor and sensing capacitor, wherein the sensing circuit generates an inactive sensing output signal at the sensing circuit output when no ESD event is detected and an active sensing output signal when an ESD event is detected to activate the biasing circuit.

7. The device of claim 6 wherein the biasing circuit comprises:
    first and second transistors coupled in series between the first and second power rails, a first terminal of the first transistor is coupled to the first power rail and a first terminal of the second transistor is coupled to the second power rail;
    the biasing input is coupled to gates of the first and second transistors; and
    a biasing output is coupled to common second terminals of the first and second transistors and to the transistor body of the transistor at risk.

8. The device of claim 7 wherein:
    the first biasing transistor is a p-type transistor;
    the second biasing transistor is a n-type transistor; and
    when the protection circuit activated, the first biasing transistor is switched on and the second biasing transistor is switched off to allow current to flow from the first power rail to the biasing output through the first transistor.

9. The device of claim 8 wherein the current at the biasing output flows to the body of the transistor at risk to produce the protection bias to reduce $V_{DIFF}$.

10. The device of claim 8 comprises:
    a biasing output resistor coupled to the biasing output and the second power rail, wherein the current at the biasing output flows through the resistor to produce the protection bias to reduce $V_{DIFF}$.

11. The device of claim 5 wherein:
    the internal circuit is an inverter which includes an second transistor coupled in series with the transistor at risk between first and second rails, the first terminal of the second transistor is coupled to the first rail and the first terminal of the transistor at risk is coupled to the second rail;

the internal circuit comprises an inverter input which couples the I/O pad to gates of the second transistor and the transistor at risk; and the internal circuit comprises an inverter output which is coupled to common second terminals of the second transistor and the transistor at risk.

12. The device of claim 11 wherein:
the second transistor is a p-type transistor; and
the transistor at risk is a n-type transistor.

13. The device of claim 5 comprises a rail based ESD protection circuit coupled to the transistor at risk.

14. The device of claim 5 comprises a pad based ESD protection circuit coupled to the transistor at risk.

15. A method for forming a device comprising:
forming an input/output (I/O) pad,
forming an internal circuit, a gate dielectric protection module and an ESD protection circuit, wherein the internal circuit, the gate dielectric protection module and the ESD protection circuit are separate and distinct circuits, and wherein
the internal circuit is coupled between a first power rail which is a high power rail and a second power rail which is a ground rail and the internal circuit is coupled to the I/O pad, wherein forming the internal circuit comprises forming a first transistor which is a transistor at risk having a transistor body and a gate, the gate includes a gate electrode over a gate dielectric, wherein the transistor at risk operates normally under normal operational bias voltage when no ESD event and is susceptible to damage and requires protection during an ESD event, and the gate dielectric protection module is coupled to the transistor body of the transistor at risk, wherein the gate dielectric protection module functions to protect the gate dielectric of the transistor at risk of the internal circuit during an ESD event and, when activated, provides a protection bias to the transistor body of the transistor at risk to reduce a voltage difference between the gate of the transistor at risk and substrate ($V_{DIFF}$) of the transistor at risk to below a breakdown voltage ($V_{BD}$) of the gate dielectric of the transistor at risk, and the ESD protection circuit is switched off during no ESD event and provides a current path from the first power rail to the ground rail to dissipate an ESD current during an ESD event.

16. The method of claim 15 wherein the gate dielectric protection module provides the protection bias to the transistor body of the transistor at risk to increase the substrate voltage ($V_{SUB}$) to reduce $V_{DIFF}$ to at least 5% below $V_{BD}$.

17. The method of claim 15 wherein the gate dielectric protection module provides the protection bias to increase the substrate voltage ($V_{SUB}$) to reduce $V_{DIFF}$ below $V_{BD}$.

18. A method for protecting gate dielectric comprising:
providing an internal circuit and a protection module, wherein the internal circuit and protection module are separate and distinct circuits and they are not part of an ESD protection circuit, wherein
the internal circuit comprises a first transistor which is a transistor at risk having a transistor body and a gate, the gate includes a gate electrode over a gate dielectric which is to be protected, wherein the transistor at risk operates normally under normal operational bias voltage when no ESD event and is susceptible to damage and requires protection during an ESD event;
the protection module is coupled to the transistor body of the transistor at risk, the protection module functions to protect the transistor at risk of the internal circuit during an ESD event; and
activating the protection module to provide a protection bias to the transistor body of the transistor at risk to reduce a voltage difference between a gate of the transistor at risk and a substrate ($V_{DIFF}$) of the transistor at risk to below a breakdown voltage ($V_{BD}$) of a gate dielectric of the transistor at risk, and activating the ESD protection circuit to conduct a current from a first power rail to a ground rail to dissipate an ESD current during an ESD event.

19. The device of claim 1 wherein the ESD protection circuit is coupled to I/O pad and wherein the ESD protection circuit comprises at least one grounded gate n-type MOS transistor having a drain terminal coupled to the I/O pad and a source terminal and a gate terminal commonly coupled to the ground rail.

20. The device of claim 1 wherein the ESD protection circuit is coupled to the I/O pad and wherein the ESD protection circuit comprises at least one diode pair which is serially coupled between the first and second power rails.

* * * * *